United States Patent [19]

Moore et al.

[11] 4,133,022
[45] Jan. 2, 1979

[54] RACK ASSEMBLY

[75] Inventors: Leonard W. Moore; Ronald L. Bodle, both of Northridge; Conrad Fiederer, Agoura, all of Calif.

[73] Assignee: Moore Industries, Sepulveda, Calif.

[21] Appl. No.: 759,883

[22] Filed: Jan. 17, 1977

[51] Int. Cl.² ............................................. H02B 1/02
[52] U.S. Cl. ..................................... 361/415; 73/204; 73/756; 339/16 R
[58] Field of Search .................... 339/16 R, 65, 91 R, 339/92 M, 45 M; 73/204, 420; 211/41; 361/415

[56] References Cited

U.S. PATENT DOCUMENTS

| 3,278,714 | 10/1966 | Bernutz | 339/91 R |
|---|---|---|---|
| 3,709,035 | 1/1973 | De Fries et al. | 73/204 |
| 3,848,953 | 11/1974 | Petroshanoff | 339/65 |
| 3,917,370 | 11/1975 | Thornton et al. | 339/16 R |
| 3,981,199 | 9/1976 | Moore et al. | 73/420 |
| 4,064,551 | 12/1977 | Lightfoot | 361/399 |

FOREIGN PATENT DOCUMENTS 1576555   8/1969   France ................................. 339/91 R Primary Examiner—David Smith, Jr.
Attorney, Agent, or Firm—Julius Rubinstein

[57] ABSTRACT

A plurality of spaced parallel guides are mounted on a support. The edges of printed circuit boards are mounted in these guides. The printed circuit boards are formed with the male portion of an electrical connector at one end and a locking and regulating plunger at the opposite end.

The support is provided with the female portion of an electrical connector which is positioned so that when the edges of the printed circuit board are mounted in the guides, the male part of the connector is aligned with the female connector whereby the male connector can penetrate the female connector. The plunger both locks the printed circuit board on the rack and regulates the depth of penetration of the male connector into the female connector.

4 Claims, 9 Drawing Figures

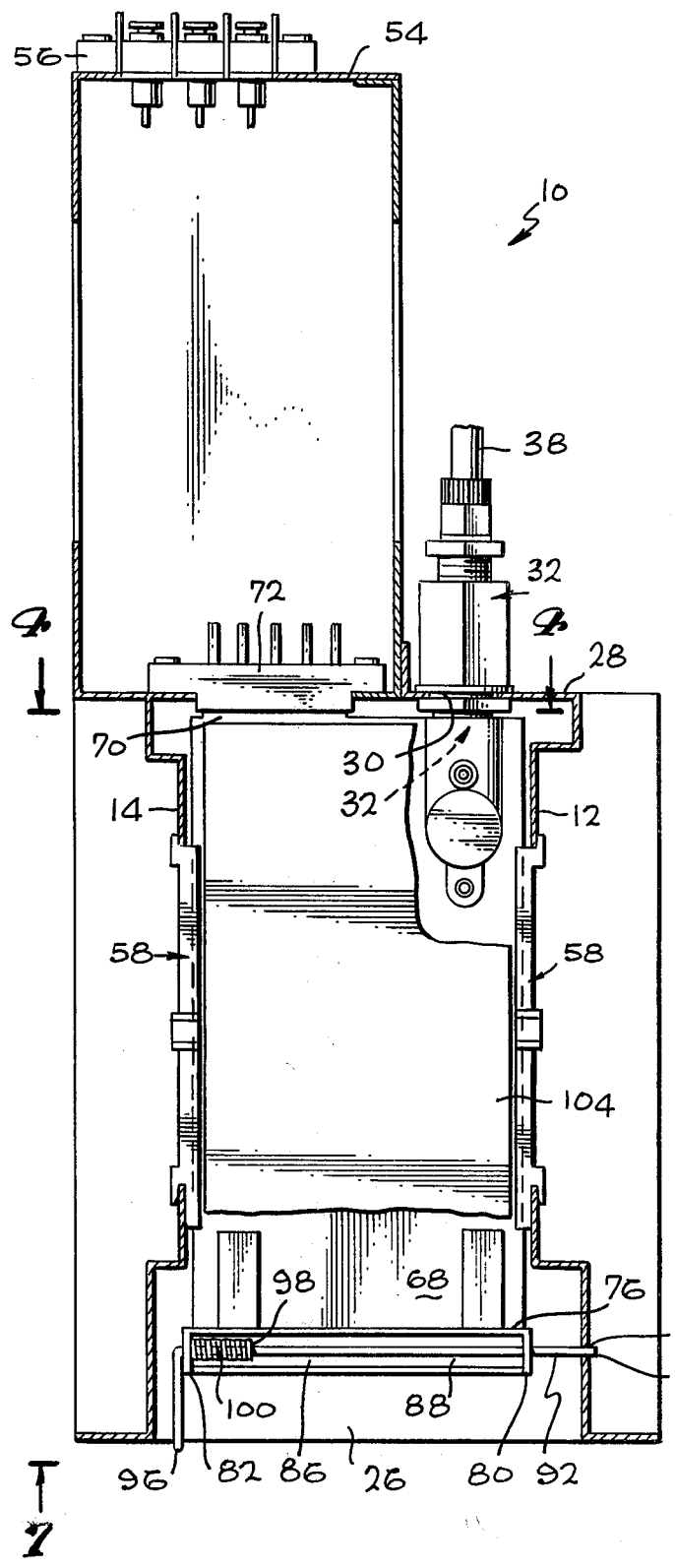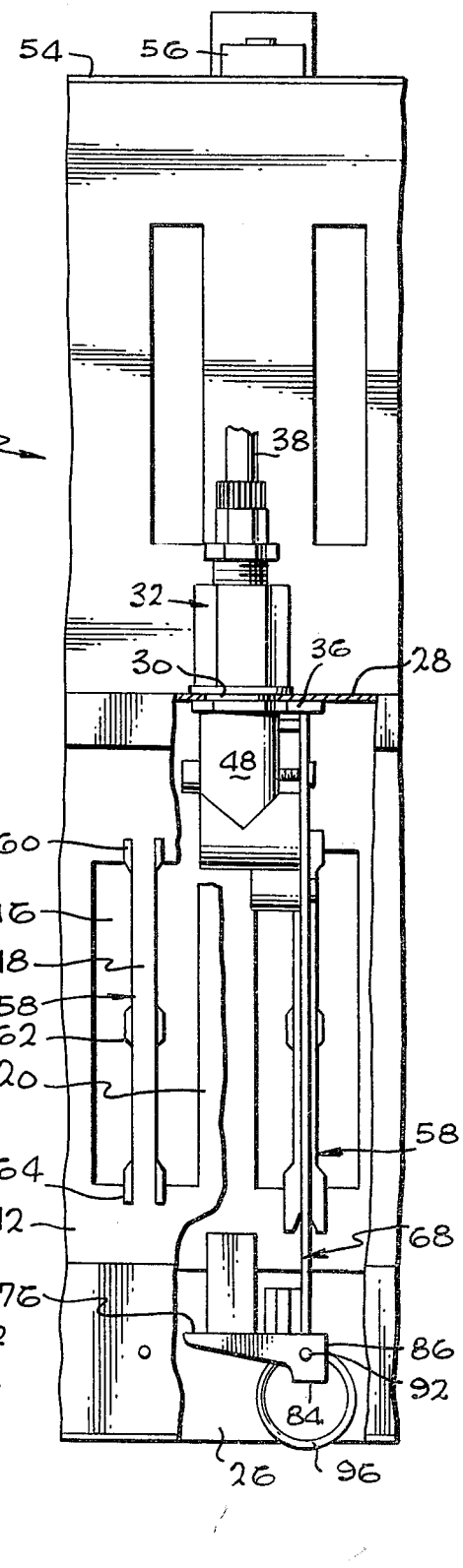

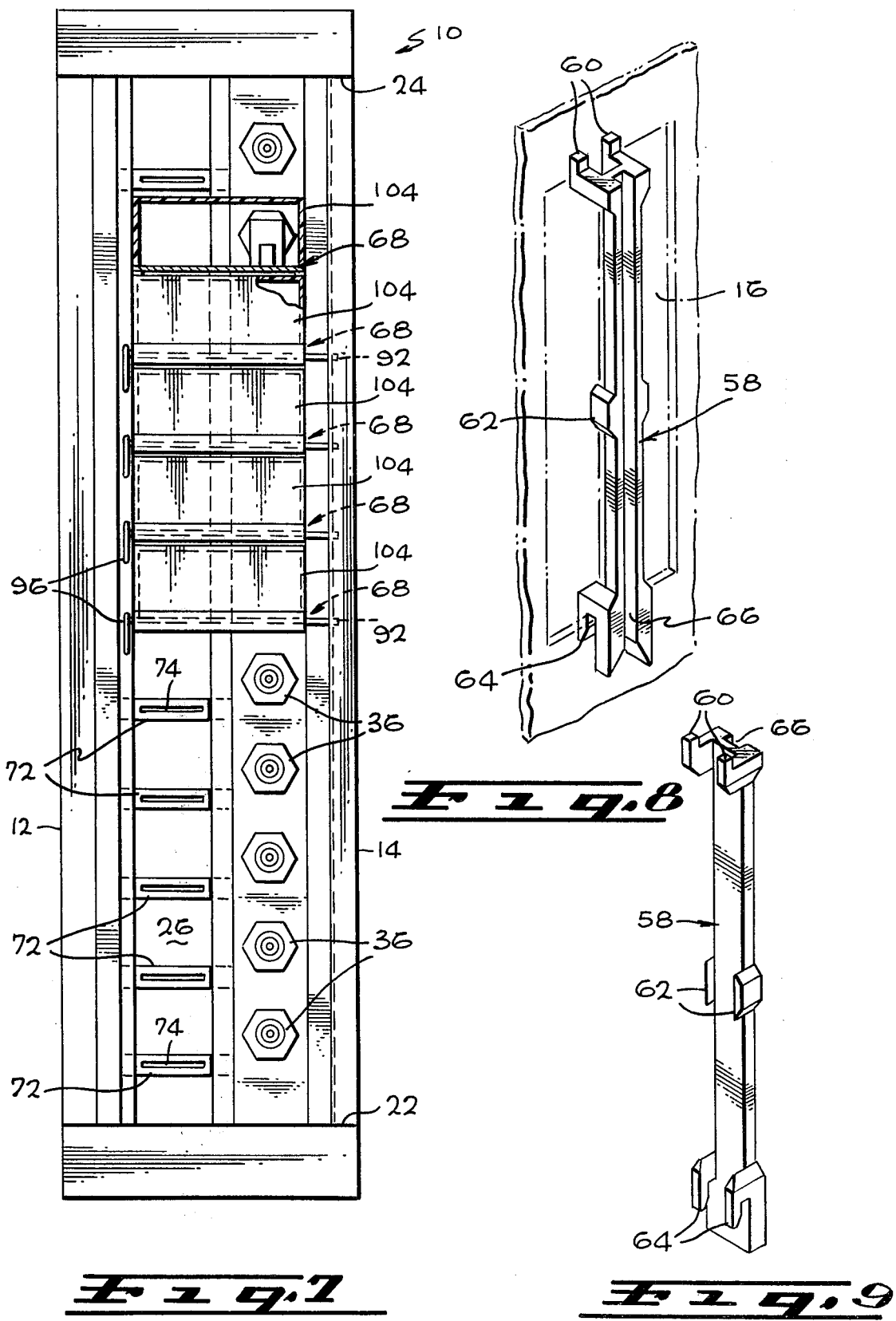

RACK ASSEMBLY

BACKGROUND AND BRIEF SUMMARY

An ever-increasing number of complex processes in various industries are monitored or regulated by one or more electronic devices. This is particularly true in processes which use complex pressurized systems because the current trend is to convert line pressure at various locations into proportional voltages or currents. Typically, a conversion from pressure into an equivalent voltage or current utilizes a diaphragm which moves in accordance with the line pressure exerted against it, as set forth in greater detail in U.S. Pat. No. 3,981,199. The diaphragm actuates an electrical device which provides a voltage or current proportional to the pressure. The voltage or current so developed is typically so small that amplification is required. The circuit for providing this amplification along with the pressure transducer itself may be mounted on a printed circuit board.

Since the pressure may have to be regulated or monitored at a plurality of points in a plant, a corresponding number of pressure transducers mounted on printed circuit boards will be required. This suggests that a rack would be a convenient way to hold the printed circuit boards together for connection into an electrical network.

It is desirable for the printed circuit board to be easily and removably mounted on the rack for service or replacement. To do this, the printed circuit boards may be provided with male connector portions formed thereon while one or more female connector portions may be mounted on the rack to receive the male connector portions on the board. In this way, when the boards are inserted in the rack the male connector portions penetrate the female connector portions to make the required electrical connections.

However, difficulties can arise if the male connector portion on the printed circuit board is not aligned properly with the female connector portion because the printed circuit board and the electrical connector could be damaged. Further, if the male connector portion is not inserted far enough inside the female connector portion, the resulting electrical connection may be faulty. In addition, if the male connector portion is inserted in the female connector portion too forcibly in an effort to achieve sufficient penetration, this could damage both the male connector portion and the female connector portion.

What is needed therefore, and comprises an important object of this invention, is to provide a rack having a plurality of female connector portions mounted thereon, and guideways sized to receive the edges of printed circuit boards to hold the printed circuit boards on the rack in spaced relation to each other and on the rack in such a way that the male connector formed on each printed circuit board is aligned with a female connector portion on the rack so the male connector portions can penetrate the female connectors without damage.

A further object of this invention is to provide a mechanism for regulating the penetration of the male connector portion to the printed circuit board into the female connector portion.

Yet a further object of this invention is to provide means for releasably locking a printed circuit board onto a rack.

Still a further object of this invention is to provide a rack having a plurality of tubular connectors formed thereon wherein each tubular connector is adapted to be connected to a pressurized line and where the rack is provided with a plurality of electrical connectors for receiving a printed circuit board which has an integrally formed male connector portion thereon.

These and other objects of this invention will become more apparent when better understood in the light of the accompanying specifications and drawings wherein:

FIG. 2 is a sectional plan view of the rack showing a printed circuit board in position on the rack.

FIG. 3 is a sectional side elevational view of a portion of a rack showing an edge view of a printed circuit board and pressure transducer housing connected to a pressurized line.

FIG. 7 is a front view of the rack showing a plurality of printed circuit boards mounted therein.

FIG. 8 is a rear, enlarged perspective view of a plastic guide and a portion of the rack, showing how the guides are removably mounted on the rack.

FIG. 9 is a perspective view of the plastic guide which is removably mounted on the rack.

Figure 1:
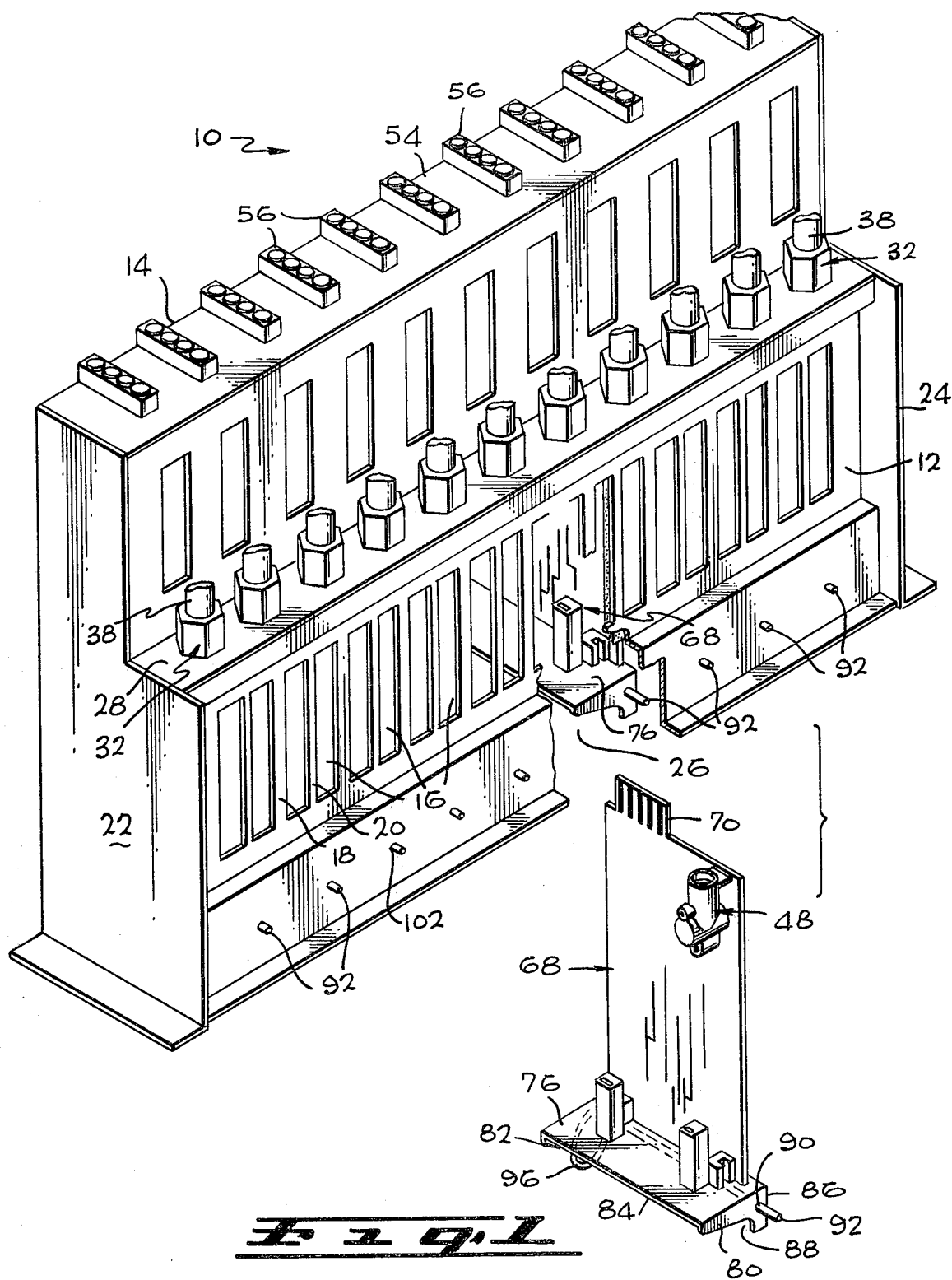
FIG. 1 is a perspective view of the rack, embodying the principals of this invention but with a portion broken away, showing a printed circuit board removed from the rack.

Referring now to FIG. 1 of the Drawings, a rack indicated generally by the reference numeral 10 includes spaced parallel bottom and top walls 12 and 14. The walls are provided with ventilation openings or windows 16 separated, in this embodiment, by alternate narrow and wide connecting strips 18 and 20. Walls 12 and 14 are connected together by end walls 22 and 24, see FIGS. 1 and 7. The rack is provided with an open front 26 and a first rear wall 28 disposed in a plane parallel to the open front 26.

The narrow strips 18 serve as guide supports. Each strip 18 on wall 12 is paired with a corresponding strip on wall 14 which is at the same distance from end walls 22 and 24, so that the pairs of parallel strips are parallel to each other and define a plane parallel to the end walls 22 and 24.

Figure 5:
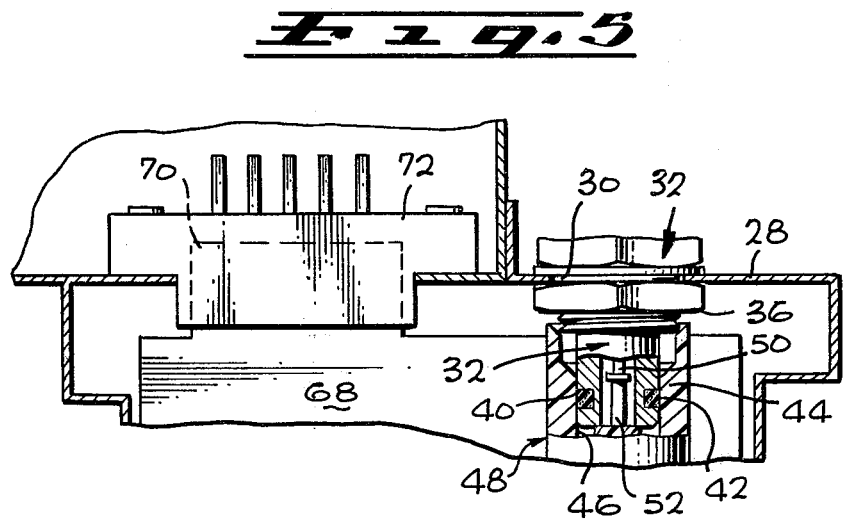
FIG. 5 is a plan view of a portion of the rack with a portion of the pressure transducer housing broken away to show the connection between the pressure transducer housing and a tubular coupling.
Figure 6:
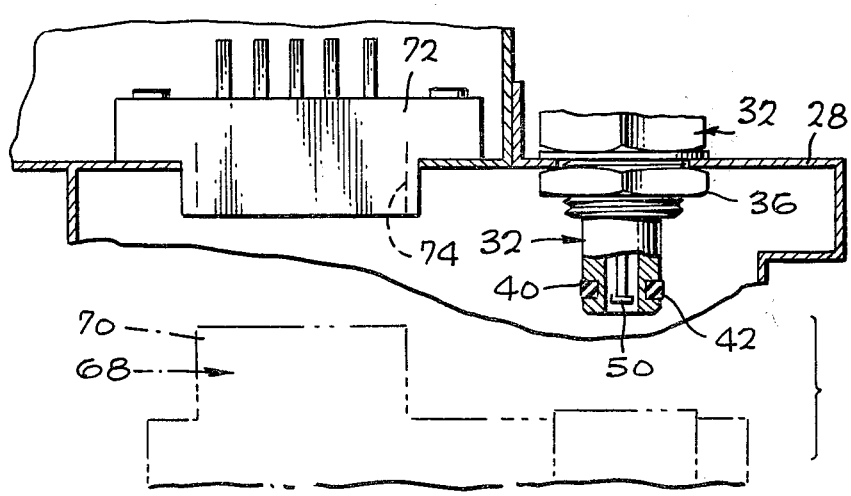
FIG. 6 is a view similar to that shown in FIG. 5 but with a pressure transducer housing removed to show the tubular coupling.

The first rear wall 28 is secured to the parallel walls 12 and 14 and the end walls 22 and 24. This wall is provided with a plurality of openings or bores 30, see FIGS. 2 and 3. A tubular member 32 is mounted in each bore and is secured therein by a locking nut 36. The tubular member 32 is connected to a pressurized line 38 by any suitable means. In addition, the extreme end of the tubular member is provided with a groove 40 for holding an "O" ring 42, see FIGS. 5 and 6. The "O" ring is designed to be in sealing engagement with the "O" ring engaging wall 44 formed in bore 46 in the pressure transducer housing 48, as described more fully in U.S. Pat. No. 3,961,119.

The tubular member 32 is provided with a valve actuated by a valve pin 50. The valve is biased so the pressure line 38 is closed. The pressure transducer housing has a pin 52 inside for engaging the pin 50 of the valve when the tubular member 32 is inserted inside the bore 40. This occurs because valve pin 50 engages pin 52 which forces the valve into a valve-open position admitting pressure into the pressure transducer housing 48. Furthermore, when the tubular member is separated from the pressure transducer housing, the valve pin 50 moves away from the pin 52 whereby the valve is moved to a valve closed position preventing pressure from escaping from the pressure line 38.

A second rear wall 54 is connected to end walls 22 and 24. This rear wall is parallel to and offset from rear wall 28, see FIG. 1. A plurality of electrical terminal strips 56, one for each tubular member 38, is mounted on the rear wall 54.

As will become more apparent below, there is a pair of narrow strips 18 on parallel walls 12 and 14 for each tubular coupling and terminal 56.

Figure 4:
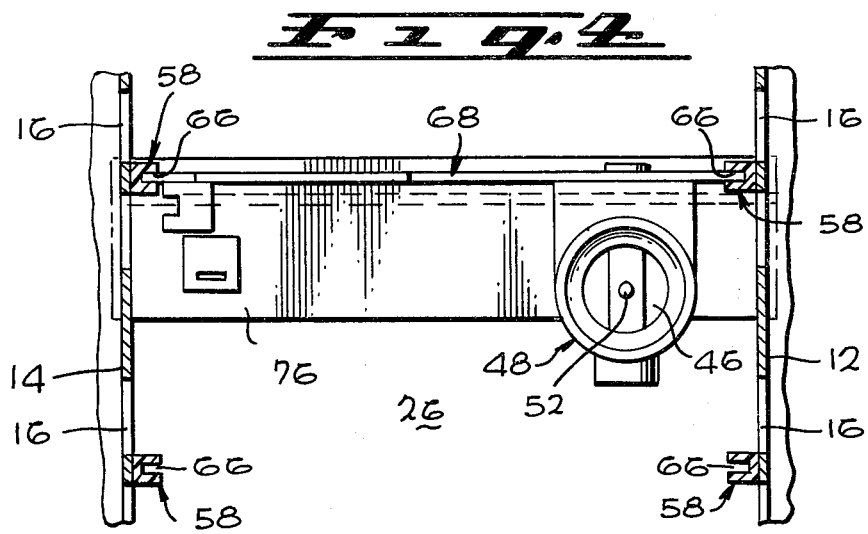
FIG. 4 is a sectional view taken on line 4—4 of of FIG. 2.

Guides 58, which in this instance are formed from nylon, are removably mounted on each narrow guide support strip 18 by means of resiliant mounting lug 60, 62, and 64, which are formed on one side of the guide strip 58. The guides are channel-shaped in cross section and define grooves 66 which serve as guideways for the circuit boards. The grooves are formed on the side of the guide strip opposite the mounting lugs, see FIGS. 8 and 9. In addition, the guide strips 58 are mounted on the narrow strips, so the grooves 66 face each other in pairs, see FIG. 4. This arrangement provides the rack with a plurality of pairs of facing guideways, see FIG. 7.

Pressure transducer housings 48 are mounted on the printed circuit boards 68. The electrical components mounted on these boards provide whatever amplification or treatment of the signal from the pressure transducer that may be required. Each printed circuit board is provided with an integrally formed male connector portion 70 at one end, see FIG. 1.

As seen in FIG. 1, the male portion 70 is narrower than the remaining portion of the printed circuit board. This narrowness, combined with the thinness of the printed circuit board, necessarily makes the male connector portion generally more fragile and susceptible to damage if not handled carefully than the remaining portion of the printed circuit board.

A plurality of spaced parallel female connector portions 72 are mounted on the rack, one for each pair of guide strips, tubular members 32 and terminal strips 56. The female connector portions are provided with grooves 74 sized to receive the male connector portions 70. The grooves 74 in these female connectors are in fixed relationship (in this case in the same plane) as the plane defined by facing grooves 66 on the guide strips 58, see FIGS. 2 and 3. The width of the printed circuit board is selected so when the printed circuit board 58 is inserted through the front end 26 of the rack, the side edges of the printed circuit board ride in the grooves 66 of the guide strips. In addition, each pressure transducer housing 48 is positioned so the bore 46 is located in axial alignment with the tubular member 32 when the printed circuit board is mounted on the rack. Consequently, when a printed circuit board is inserted in the rack so the edges of the bore are in the groove 66, the male portion 70 is aligned with the grooves 74 in the female connector portion 72 and the bore 46 of pressure transducer housing 48 is in axial alignment with and can receive a tubular member 32.

The rack 10 is designed to releasably hold a plurality of printed circuit boards in spaced parallel relationship to each other, see FIG. 7, and the spacing between the pairs of the guide strips 58 and the female connector 72 and the tubular coupling is designed to permit this.

As shown in FIG. 1, the male connector portion 70 is an integral part of the printed circuit board 58 and if it is damaged, the entire printed circuit board may have to be replaced. The male connector portion 76 must be inserted in the groove 74 in the female connector portion far enough to make a good electrical connection. If this is not accomplished, an error could be introduced into the electrical output of the printed circuit board.

In addition, the male connector portion 70 must be inserted into the female connector portion without too much force which could damage the male connector portion 70. This requires that the depth of penetration of the male connector portion into the female connector portion be regulated.

To do this, the printed circuit board 68 is provided with a front panel 76, which is in this embodiment, removably attached to the printed circuit board by screws or by any other suitable means, see FIG. 1.

The front panel 76 is provided with forwardly projecting integrally formed edge flanges 80 and 82 and a front flange 84 and a bottom flange 86 defining a rod receiving groove 88 in the front panel 76, see FIG. 3. Edge flanges 80 and 82 are provided with axially aligned rod receiving openings 90 through which a rod 92 extends. One end, 94, of the rod 92 serves as a detent and the opposite end 96 is bent in a circle to form a pull member. A stop member 98 is secured to the rod and a coil spring 100 is mounted on the rod bearing against the stop member and side flange 82, see FIG. 2. This coil spring acts to bias the rod 92 so the detent 94 projects outwardly from the edge flange 80.

A plurality of rod receiving holes 102 are formed in parallel wall 12. The length of the rod is such that in order to insert a printed circuit board 68 in the front panel on a rack, the handle or pull member 96 of the front panel has to be pulled against the bias of the coil spring to cause the detent member 94 to retract toward the edge flange 80. Then, when the printed circuit board is inserted in the rack with the male connector portion 70 of the board inserted far enough in the female connector portion, detent 94 will be aligned with a hole 102 and the pull member is released. The coil spring 100 bearing against the stop member 98 and the side flange 82 and acts to bias the rod 92 so the detent 94 which projects outwardly from flange 80 and enters the hole 102 releasably locking the printed circuit board on the rack.

With the arrangement, the printed circuit board 68 can be removed and replaced in the rack without damaging the connectors and at the same time a good electrical connection between the male connector portion 70 and the female connector portion is insured. A cover 104 may be mounted on each printed circuit board to permit the printed circuit boards to be carried or stacked off the rack without damage. Typically, the cover could be formed from plastic and would be generally channel shaped in cross-section.

Having described the invention, what I claim is new is:

1. A printed circuit board for a rack, said printed circuit board having spaced side portions, a male electrical connector portion formed at one end, a panel secured to the opposite end of said printed circuit board, said panel having means thereon for locking said printed circuit board on the rack, said panel being transverse to said printed circuit board and provided with edge flanges, a front flange, and a bottom flange defining a rod receiving groove, axially aligned rod receiving holes formed in the edge flanges, a rod extending through said holes, a handle on one end of said rod, the opposite end of said rod extending through a rod receiving hole and serving as a detent, stop means formed on the rod, a coil spring mounted on the rod bearing against the stop member and a flange to bias the rod so said opposite end projects through said hole.

2. A rack, said rack having side walls, top and bottom walls, rear walls, and an open front, female portions of electrical connectors and tubular couplings mounted on the rear walls in spaced relation to each other, pairs of guides mounted on the side walls of the rack, each guide channel shaped in cross-section defing a groove and mounted on the side walls of the rack so the grooves in the guides face each other, printed circuit boards, the width of each printed circuit board such that the sides of the boards fit in said grooves whereby the printed circuit boards may be held in spaced parallel relationship to each other on the rack, each of said tubular couplings adapted to be connected to a source of pressure and having a pin-actuated valve to close the tubular coupling to prevent the escape of pressure, at least one of said printed circuit boards having a pressure transducer housing mounted thereon, said housing having a tubular coupling receiving bore formed therein, pin engaging means mounted in the bore for engaging the pin of the pin-actuated valve whereby when the tubular coupling is inserted in the bore, said pin-engaging means engages said pin to open said pin-actuated valve and admit pressure into said pressure transducer housing, each printed circuit board having a protruding comparatively narrow generally fragile male part formed at the rear edge, defining the male portion of an elctrical connector, each of said female portions of the electrical connector having a groove facing the front of the rack and in the plane defined by the facing grooves of the guides whereby when a printed circuit board is mounted in the grooves of the guides, its male portion is aligned with said female portion, said pressure transducer housing bore positioned so the bore faces and is aligned with said tubular coupling whereby when the printed circuit board is moved on said guides the male portion of the electrical connector can penetrate the female portion and the tubular coupling can penetrate the bore in the pressure transducer housing, and a combined locking and regulating device, said combined locking and regulating device including a panel secured to the front end of said printed circuit board, said panel mounted transverse to said board and provided with side flanges, a front flange, and a bottome flange defining a rod receiving groove, axially aligned rod receiving holes formed in the said flanges, a rod extending through said holes, a handle on one end of said rod, the opposite end of said rod extending through a rod receiving hole in said side flange and serving as a detent, stop means formed on the rod, a coil spring mounted on the rod bearing against the stop member and a flange to bias the rod so said opposite end projects through said hole in said side flange, a rod receiving hole associated with each pair of guides formed in the bottom wall of the rack and positioned so that when the printed circuit board is positioned correctly on the rack so the male portion of the electrical connector is at the correct depth inside the female portion of the electrical connector and the tubular coupling is inside the bore in the pressure transducer housing, said rod receiving hole in the bottom wall is aligned with said rod mounted on said front panel whereupon said coil spring biases said rod so the detent portion enters said rod receiving hole on the side wall to lock the printed circuit board on the rack without damage to the male portion of the electrical connector.

3. An apparatus of the class described comprising a support, a printed circuit board adapted to be mounted on said support, said printed circuit board having spaced side portions, a male part of an electrical connector at one end of said printed circuit board and a panel attached to the opposite end of said printed circuit board, said support having the female portion of an electrical connector thereon, guide means on said support for receiving the side portions of said printed circuit board to hold said printed circuit board in such a way that the male portion of the electrical connector is aligned with the female portion of the electrical connector whereby the portions of the electrical connector can be connected together, and a combined locking and regulating device on said panel and said support for regulating the depth of penetration of the male portion of the electrical connector into said female portion and for locking the printed circuit board on the support, said combined locking and regulating device on said panel including a rod moveably mounted on said panel transverse to said spaced side portions, at least one rod receiving hole on said support for receiving said rod, said at least one hole positioned so that when said rod is moved so it penetrates said hole, the male portion of said electrical connector is at the correct depth inside said female portion and the printed circuit board is locked on said support.

4. A rack, said rack having side walls, top and bottom walls, rear walls, and an open front, female portions of electrical connectors and tubular couplings mounted on the rear walls in spaced relation to each other, pairs of guides mounted on the bottom and top walls of the rack, each guide channel shaped in cross-section defining a groove and mounted on the top and bottom walls of the rack so the grooves in the guides face each other, printed circuit boards, the width of each printed circuit board such that the sides of the boards fit in said grooves whereby the printed circuit boards may be held in spaced parallel relationship to each other on the rack, each of said tubular couplings adapted to be connected to a source of pressure and having a pin-actuated valve to close the tubular coupling to prevent the escape of pressure, at least one of said printed circuit boards having a pressure transducer housing mounted thereon, said housing having a tubular coupling receiving bore formed therein, pin engaging means mounted in the bore for engaging the pin of the pin-actuated valve whereby when the tubular coupling is inserted in the bore, said pin-engaging means engages said pin to open said pin-actuated valve and admit pressure into said pressure transducer housing, each printed circuit board having a comparatively narrow generally fragile protruding male part formed at the rear edge defining the male portion of an electrical connector and a panel attached to the front edge, each of said female portions of the electrical connector having a groove facing the front of the rack and in the plane defined by the facing grooves of the guides whereby when printed circuit board if mounted in the grooves of the guides, its male portion is aligned with said female portion, said pressure transducer housing bore positioned so the bore faces and is aligned with said tubular coupling whereby when the printed circuit board is moved on said guies the male portion of the electrical connector can penetrate the female portion and the tubular coupling can penetrate the bore in the pressure transducer housing, and a combined locking and regulating device connected to said rack and the said panel both to lock the printed circuit board on the rack and to regulate the penetration of said male portion of the electrical connector into said female portion and the penetration of the tubular coupling into said bore in said pressure transducer housing to prevent damage to said male portion, said combined locking and regulating device on said panel comprising a rod moveably mounted transverse to the guides on said rack, rod receiving holes on the rack associated with each pair of guides and positioned so that when a rod is moved so it penetrates a hole, the printed circuit board to which the rod is attached is locked on the rack, and the male portion of the electrical connector is at the correct depth inside the female portion and the tubular coupling is at the correct depth inside the bore in the pressure transducer housing.

* * * * *